United States Patent [19]
Ahn

[11] Patent Number: 6,144,596
[45] Date of Patent: *Nov. 7, 2000

[54] SEMICONDUCTOR MEMORY TEST APPARATUS

[75] Inventor: Yeong Chang Ahn, Cheongju, Rep. of Korea

[73] Assignee: Hyundai Electronics Industries Co., Ltd., Ichon-shi, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 09/188,410

[22] Filed: Nov. 10, 1998

[30] Foreign Application Priority Data

Nov. 20, 1997 [KR] Rep. of Korea ........................ 97-61443

[51] Int. Cl.$^7$ ........................................................ G11C 7/00
[52] U.S. Cl. ............................................. 365/201; 365/191
[58] Field of Search ................................... 365/201, 191; 371/21.2

[56] References Cited

U.S. PATENT DOCUMENTS

| | | | |
|---|---|---|---|
| 5,610,867 | 3/1997 | DeBrosse et al. | 365/201 |
| 5,777,932 | 7/1998 | Chonan | 365/201 |
| 5,793,685 | 8/1998 | Suma | 365/201 |
| 5,933,379 | 8/1999 | Park et al. | 365/201 |

*Primary Examiner*—Do Hyun Yoo
*Attorney, Agent, or Firm*—Fleshner & Kim, LLP

[57] ABSTRACT

A semiconductor memory test apparatus includes a test signal input unit for externally receiving a test word line model signal and a test column address pulse enable signal, which are used for a memory operation in the test mode. The test apparatus also includes a test mode setting unit that receives: a row address strobe bar signal, a column address strobe bar signal, a write enable bar signal and an address signal, and that generates first and second test mode setting signals. A first switching unit switches a signal input from a row address path circuit or from the test signal input unit, in accordance with a first test mode setting signal. A second switching unit switches another signal input from the row address path circuit or from the test signal input unit in accordance with a second test mode setting signal, and outputs the switched signal to the column address path circuit.

19 Claims, 4 Drawing Sheets

FIG. 2A BACKGROUND ART /RAS
FIG. 2B BACKGROUND ART WLMODEL
FIG. 2C BACKGROUND ART SAEN
FIG. 2D BACKGROUND ART SN
FIG. 2E BACKGROUND ART SPb
FIG. 2F BACKGROUND ART CAPEN
FIG. 2G BACKGROUND ART ATD
FIG. 2H BACKGROUND ART PYCb
FIG. 2I BACKGROUND ART YSELi

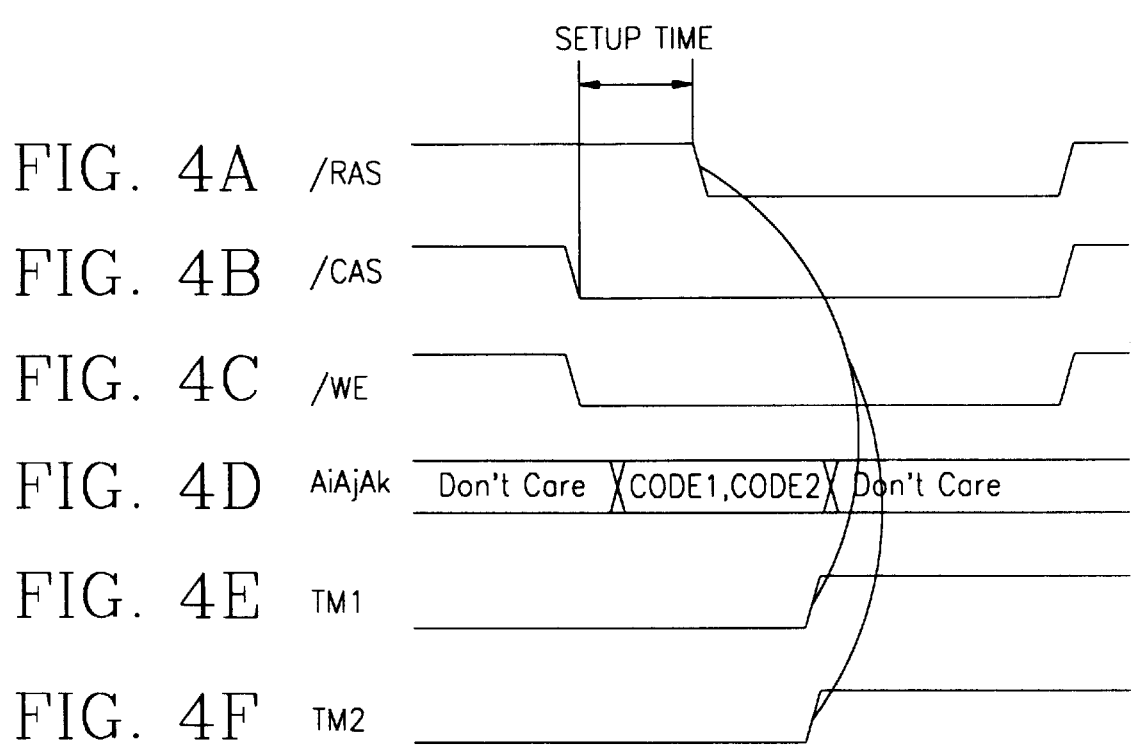
FIG. 4A /RAS
FIG. 4B /CAS
FIG. 4C /WE
FIG. 4D AiAjAk
FIG. 4E TM1
FIG. 4F TM2

SEMICONDUCTOR MEMORY TEST APPARATUS

BACKGROUND OF THE INVENTION

1. Field of the Invention

The present invention relates to a semiconductor memory test apparatus, and in particular to an improved semiconductor memory test apparatus which is capable of testing a signal margin of a semiconductor memory.

2. Description of the Background Art

FIG. 1 is a view illustrating the internal construction of a known DRAM. As shown therein, there are provided a row control block 1 for generating an internal control signal used for a word line driving operation when a row address strobe bar signal (/RAS) is inputted, a row decoder 2 for decoding an address signal inputted in accordance with a control signal from the row control block 1, a WLMODEL signal generation unit 3 for outputting a word line model signal (hereinafter called "WLMODEL") after a predetermined delay in accordance with a control signal from the row control block 1 and an output signal from the row decoder 2 for corresponding with an actual timing of a word line signal, an amplifier driving signal generation unit 9 for receiving the WLMODEL signal and an output signal from the row decoder 2 and generating a signal for driving a sense amplifier, a CAPEN signal generation unit 10 for receiving a control signal from the row control block 1 and the WLMODEL signal and generating a column address pulse enable (hereinafter called "CAPEN") signal, a Y-address buffer 4 for latching the address signal inputted, an ATD pulse generation unit 5 for receiving an output signal from the Y-address buffer 4 and the CAPEN signal and generating an address transition detection (hereinafter called "ATD") pulse, a PYCb signal generation unit for receiving the ATD pulse and generating a delayed signal pulse Y control bar (hereinafter called "PYCb") signal, a Y-address predecoder 6 for receiving an address signal from the Y-address buffer 4 and decoding the same, a YSEL signal generation unit 11 for generating a Y-SELection (hereinafter called "YSEL") signal in accordance with an output signal from the Y-address predecoder 6, and a sense amplifier 8 for amplifying the data of a corresponding word line in accordance with an amplifier driving signal from the amplifier driving signal generation unit 9 and outputting the data of a corresponding bit line in accordance with the YSEL signal.

FIGS. 2A through 2I are waveform diagrams of an output signal of FIG. 1. The operational timing of the known DRAM will be explained.

First, the /RAS signal becomes active "Low(L)" as shown in FIG. 2A, and the row control block 1 generates an internal control signal used for driving the row decoder 2 and the word line.

The row decoder 2 decodes an X-address signal in accordance with the control signal. When the decoded signal and the control signal from the row control block 1 are inputted into the WLMODEL signal generation unit 3, a WLMODEL signal, shown in FIG. 2B, is generated after a predetermined delay time.

In addition, the WLMODEL signal and the output signal from the row decoder 2 are inputted into the amplifier driving signal generation unit 9 consisting of a NAND-gate and multiple inverter gates, and the amplifier driving signal generation unit 9 generates a sense amplifier enable (SAEN) signal, a sense amplifier down (SN) signal, and an amplifier up bar (SPb) signal, which are shown in FIGS. 2C, 2D and 2E, and then the sense amplifier 8 is driven. The data of all memory cells of the driven word line are amplified by the sense amplifier and are stored into the memory cell and become a ready state until the YSEL signal is applied thereto.

The inputted address signal is inputted through the Y-address buffer 4 and is decoded by the Y-address predecoder 6. The CAPEN signal generation unit 10 which receives the WLMODEL signal and a control signal from the row control block 1 generates a CAPEN signal as shown in FIG. 2F.

In addition, the Y-address signal inputted through the Y-address buffer 4 and the CAPEN signal are applied to the ATD pulse generation unit 5, and an ATD pulse as shown in FIG. 2G is generated. The delay signal PYCb, shown in FIG. 2H, of the ATD pulse is generated by the PYCb signal generation unit 7.

The PYCb signal and the output signal from the Y-address predecoder 6 are applied to the YSEL signal generation unit 11, and a corresponding bit line is selected. The YSEL signal, shown in FIG. 2I, is outputted. The YSEL signal is applied to the sense amplifier 8, and the data of a corresponding line is outputted.

However, in the WLMODEL signal generation unit and the ATD pulse generation unit of the known semiconductor memory, there are provided a delay circuit consisting of CMOS gates and a load device such as a resistant capacitor, so that the timing is adjusted by a circuit simulation.

Therefore, in the known art, the operational timing of a circuit is adjusted by adjusting only a metal mask for implementing a predetermined timing operation based on a process condition and a device characteristic variation when fabricating the product. Therefore, it requires much time for securing an optimum timing. In addition, it is impossible to obtain an accurate modelling.

SUMMARY OF THE INVENTION

Accordingly, it is an object of the present invention to provide a semiconductor memory test apparatus which overcomes the aforementioned problems encountered in the background art.

It is another object of the present invention to provide a semiconductor memory test apparatus which is capable of checking a margin with respect to an optimum operational timing by externally applying a major internal operation control signal of a semiconductor memory and using the thusly checked margin for a mask correction for thereby quickly optimizing the circuit.

To achieve the above objects, there is provided a semiconductor memory test apparatus which includes a test signal input unit for externally receiving a test word line model (TWLMODEL) signal and a test column address pulse enable (TCAPEN) signal which are used for a memory operation in the test mode, a test mode setting unit for receiving a /RAS signal, a column address strobe bar (/CAS) signal, a write enable bar (/WE) signal and an address signal and generating first and second test mode setting signals, a first switching unit for switching a WLMODEL signal inputted from the row address path circuit or a TWLMODEL signal inputted from the test signal input unit in accordance with a first test mode setting signal, and a second switching unit for switching a CAPEN signal inputted from the row address path circuit or a TCAPEN signal inputted from the test signal input unit in accordance with a second test mode setting signal and outputting the switched signal to the column address path circuit.

The above objects can also be achieved, in a whole or in part, by the semiconductor memory test apparatus, wherein a number of test signal input units is determined based on the test mode determining signal.

The above objects can also be achieved, in a whole or in part, by the semiconductor memory test apparatus, wherein the test mode setting unit is directed to adjusting the number and place of the test mode setting signals based on the test mode determining signal.

The above objects can also be achieved, in a whole or in part, by the semiconductor memory test apparatus, wherein a number and position of the switching units is determined based on the test mode determining signal.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 4A through 4F are waveform diagrams of a signal in the rest mode of a DRAM according to the present invention.

DETAILED DESCRIPTION OF THE PREFERRED EMBODIMENTS

Figure 3:
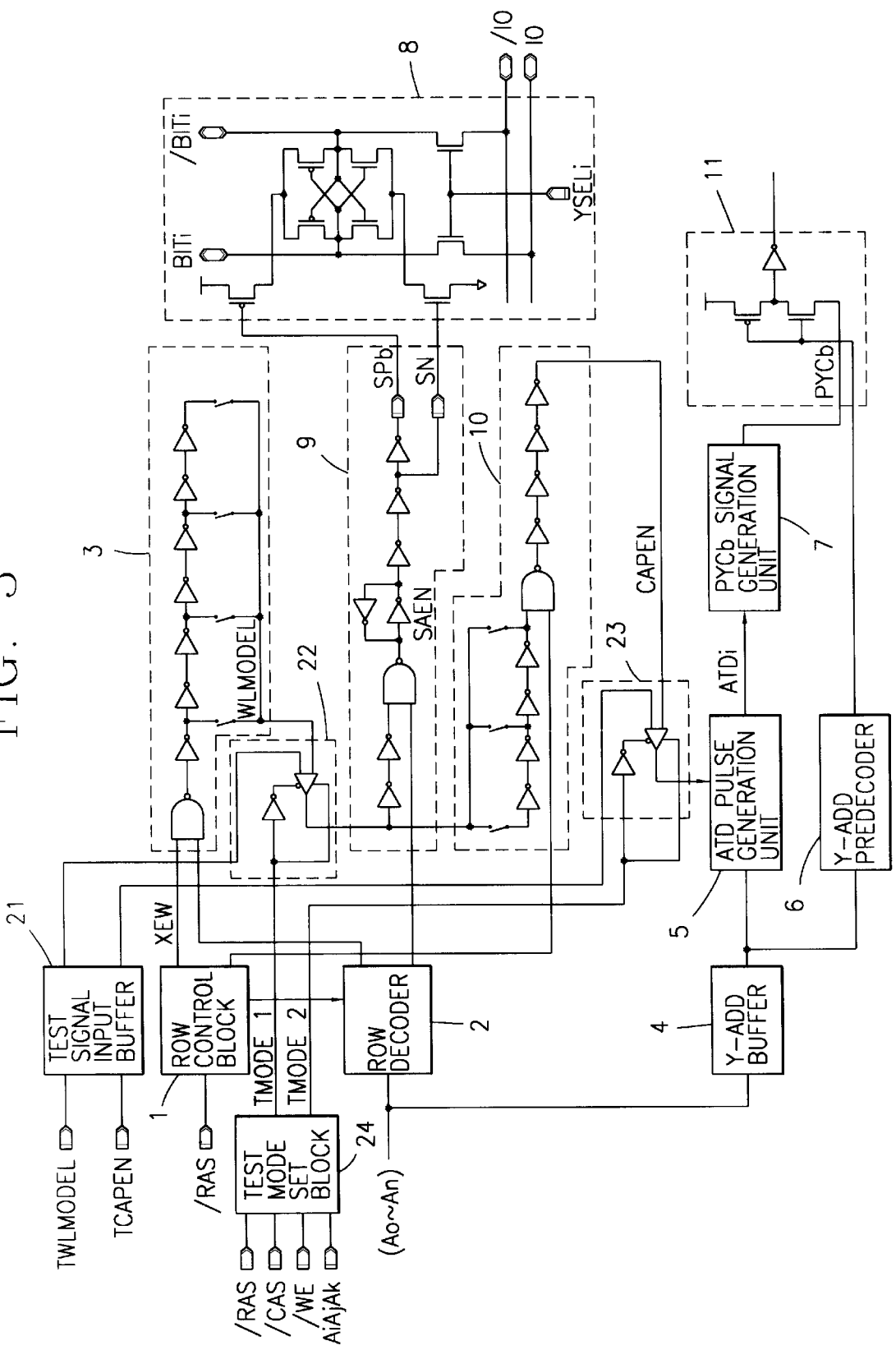
FIG. 3 is a circuit diagram illustrating the internal construction of a DRAM according to the present invention.

FIG. 3 is a circuit diagram illustrating the construction of a DRAM according to the present invention which includes a test signal input buffer 21 for externally receiving a TWLMODEL signal and a TCAPEN signal used for a memory operation in the test mode, a test mode set block 24 for receiving a /RAS signal, a /CAS signal, a /WE signal, as test mode determining signals, and an address signal and generating first and second test mode setting signals TMODE1 and TMODE2, a first switching unit 22 for switching a WLMODEL signal inputted from the WLMODEL signal generation unit 3 or a TWLMODEL signal inputted from the test signal input buffer 21 in accordance with a first test mode setting signal TMODE1 from the test mode set block 24 and outputting to an amplifier driving signal generation unit 9 and a CAPEN signal generation unit 10, respectively, and a second switching unit 23 for switching a CAPEN signal from the CAPEN signal generation unit 10 or a TCAPEN signal from the test signal input buffer 21 in accordance with a second test mode setting signal TMODE2 from the test mode set block 24 and outputting to an ATD pulse generation unit 5. The test signal input buffer 21 may include a plurality of test signal input units, depending on the characteristics of the product.

FIGS. 4A through 4F are waveform diagrams of a signal operation timing in the test mode according to the present invention.

The operation of the semiconductor memory test apparatus according to the present invention will now be explained.

The TWLMODE signal and TCAPEN signal are inputted through the test signal input buffer 21 and are applied to the first switching unit 22 and the second switching unit 23.

The test mode set block 24 receives a /RAS signal, a /CAS signal, a /WE signal and address signals Ai, Aj and Ak which are shown in FIGS. 4A through 4D and outputs first and second test mode setting signals TMODE1 and TMODE2 shown in FIGS. 4E and 4F.

The test mode set block 24 generates a high level TMODE1 signal and the thusly generated signal is applied to the first switching unit 22. The TWLMODEL signal inputted from the test signal input buffer 21 is selected by the CMOS transfer gate of the first switching unit 22 and is applied to the amplifier driving signal generation unit 9 and the CAPEN signal generation unit 10.

On the contrary, in a state that the TMODE1 signal is not outputted from the test mode set block 24, namely, in a state that a low level signal is outputted, the low level signals is applied to the control terminal of the CMOS transmission gate of the first switching unit 22 and is inverted to a high level signal by an inverter and is applied to the inverted control terminal of the CMOS transmission gate. The WLMODE signal inputted from the WLMODE signal generation unit 3 is selected and is applied to the amplifier driving signal generation unit 9 and the CAPEN signal generation unit 10.

When a high level TMODE2 signal is generated by the test mode set block 24, the thusly generated TMODE2 signal is applied to the second switching unit 23. The TCAPEN signal inputted from the test signal input buffer 21 is selected by the CMOS transfer gate of the second switching unit 23 and is applied to the ATD pulse generation unit 5.

In addition, on the contrary, in a state that the TMODE2 signal is not outputted from the test mode set block 24, namely, a low level signal is outputted, when the low level signal is applied to the second switching unit 23, the CAPEN signal inputted from the CAPEN signal generation unit 10 is selected and applied to the ATD pulse generation unit 5.

Figure 1:
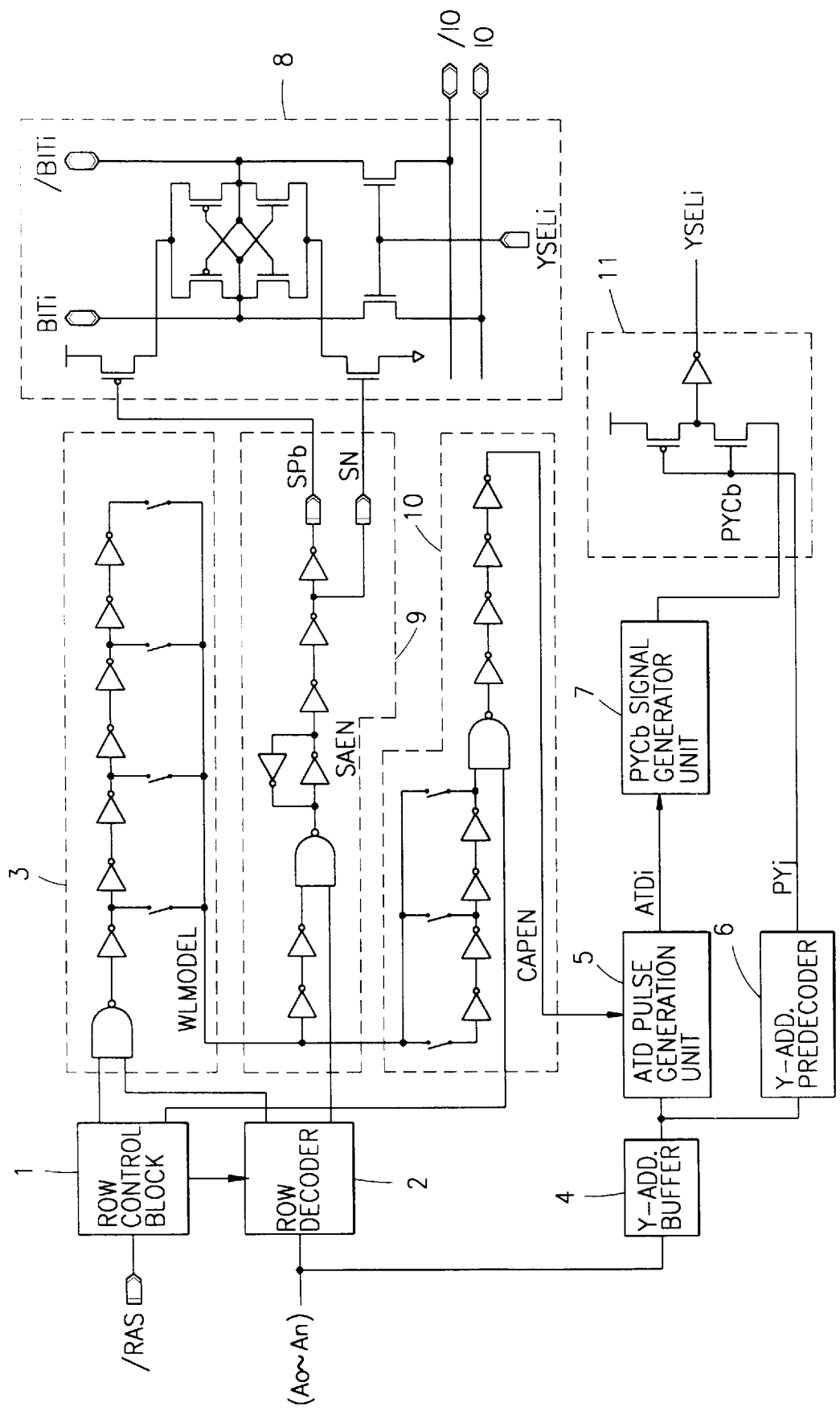
FIG. 1 is a circuit diagram illustrating the construction of a known DRAM.
Figure 2:
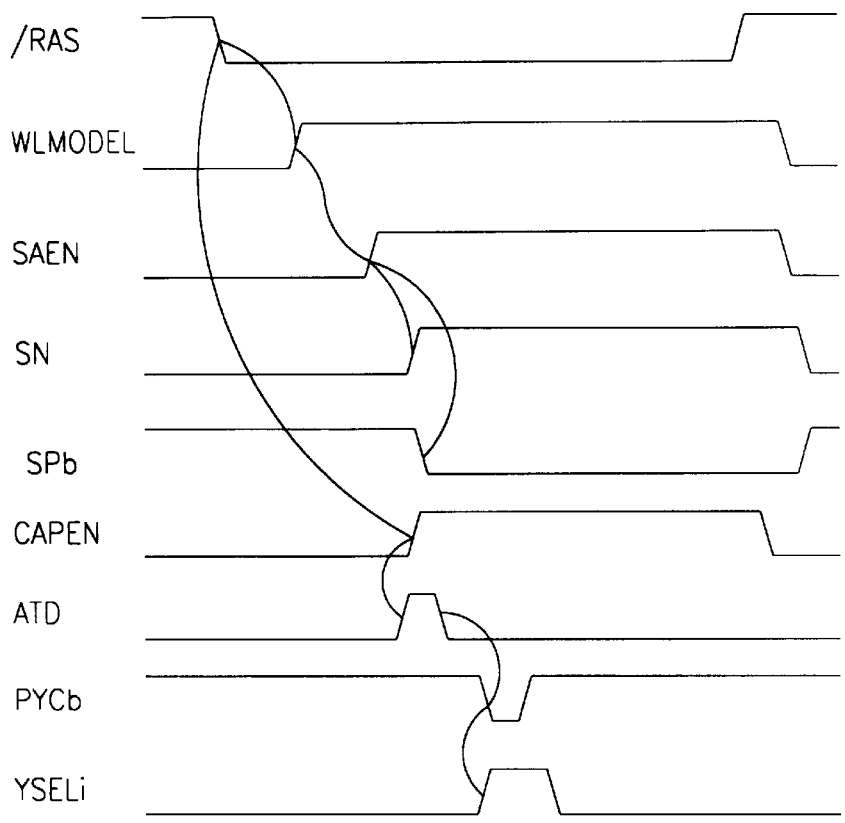
FIGS. 2A through 2I are waveform diagrams of a signal of each block of a known DRAM.

The Y-address signal from the Y-address buffer 4 and the CAPEN signal or the TCAPEN signal from the second switching unit 23 are applied to the ATD pulse generation unit 5. The ATD pulse as shown in FIG. 2G is generated, and the delay signal PYCb of the ATD pulse as shown in FIG. 2H is generated.

The PYCb signal and the output signal from the Y-address predecoder 6 are applied to the YSEL signal generation unit 11, and a corresponding bit line is selected. The YSEL signal as shown in FIG. 2I is outputted, and the YSEL signal is applied to the sense amplifier 8. Finally, a data carried on a corresponding bit line is outputted.

As described above, in the signal margin test apparatus for a semiconductor memory according to the present invention, the signals which determines the characteristic of the product are externally provided for checking the margin for implementing an optimum operational timing and using the thusly checked margin for a mask correction, so that the circuit can be quickly optimized, whereby it is possible to implement the best quality of the product. The characteristics of the product, in accordance with the signals, determines the test mode, as one skilled in the art would readily understand.

Although the preferred embodiment of the present invention have been disclosed for illustrative purposes, those skilled in the art will appreciate that various modifications, additions and substitutions are possible, without departing from the scope and spirit of the invention as recited in the accompanying claims.

What is claimed is:

1. A test apparatus, comprising:

at least one test signal input unit that externally receives a test word line model signal and a test column address pulse enable signal, which are used for a memory operation of a test mode;

a test mode setting unit that receives a row address strobe bar signal, a column address strobe bar signal, and a write enable signal, as test mode determining signals, and that generates first and second test mode setting signals;

a first switching unit that switches a word line model signal inputted from a row address circuit or the test word line model signal inputted from the at least one test signal input unit in accordance with the first test mode setting signal; and a second switching unit that switches a column address pulse enable signal inputted from a column address pulse enable signal generating circuit or a test column address pulse enable signal inputted from the at least one test signal input unit in accordance with the second test mode setting signal, and that outputs the switched signal from the second switching unit to a pulse generation unit.

2. The test apparatus of claim 1, wherein said first switching unit includes:

an inverter that inverts a first test mode setting signal; and a transfer gate that selects the word line model signal or the test word line model signal in accordance with an output signal from the inverter.

3. The test apparatus of claim 1, wherein said second switching unit includes:

an inverter that inverts a second test mode setting signal; and a transfer gate that selects the column address pulse enable signal or the test column address pulse enable signal in accordance with an output signal from the inverter.

4. The test apparatus of claim 1, wherein a number of the test signal input units is determined based on the test mode determining signals.

5. The test apparatus of claim 1, wherein said test mode setting unit is directed to adjusting a number and phase of the test mode setting signals based on the test mode determining signals.

6. The test apparatus of claim 1, wherein a number and position of the switching units is determined based on the test mode determining signals.

7. The test apparatus of claim 2, wherein the inverter is a CMOS inverter and the transfer gate is a CMOS transfer gate.

8. The test apparatus of claim 3, wherein the inverter is a CMOS inverter and the transfer gate is a CMOS transfer gate.

9. The test apparatus of claim 1, further comprising an amplifier driving signal generator that receives the word line model signal and the test word line model signal from the first switching unit, and generates an amplifier driving signal based on the first test mode setting signal.

10. The test apparatus of claim 1, further comprising a pulse generation unit that receives the column address pulse enable signal and the test column address pulse enable signal from the second switching unit, and generates a pulse signal based on the second test mode setting signal.

11. A test apparatus, comprising:

test signal input means for externally receiving a test word line model signal and a test column address pulse enable signal, which are used for a memory operation of a test mode;

test mode setting means for receiving a row address strobe bar signal, a column address strobe bar signal and a write enable signal, as test mode determining signals, and for generating first and second test mode setting signals;

first switching means for switching a word line model signal inputted from a row address circuit or the test word line model signal inputted from the test signal input means in accordance with the first test mode setting signal; and second switching means for switching a column address pulse enable signal inputted from a column address pulse enable generating circuit or a test column address pulse enable signal inputted from the test signal input means in accordance with the second test mode setting signal, and for outputting the switched signal from the second switching means to a pulse generation unit.

12. The test apparatus of claim 11, wherein the first switching means includes:

means for inverting a first test mode setting signal; and means for selecting the word line model signal or the test word line model signal in accordance with an output signal from the means for inverting.

13. The test apparatus of claim 11, wherein the second switching means includes:

means for inverting a second test mode setting signal; and means for selecting the column address pulse enable signal or the test column address pulse enable signal in accordance with an output signal from the means for inverting.

14. The test apparatus of claim 11, wherein the first and second switching means each include a number and position of switching units determined based on the test mode determining signals.

15. The test apparatus of claim 11, further comprising amplifier driving signal generating means for receiving the word line model signal and the test word line model signal from the first switching means, and for generating an amplifier driving signal based on the first test mode setting signal.

16. The test apparatus of claim 11, further comprising pulse generation means for receiving the column address pulse enable signal and the test column address pulse enable signal from the second switching means, and for generating a pulse signal based on the second test mode setting signal.

17. A method for testing a memory, comprising:

receiving a test word line model signal and a test column address pulse enable signal, which are used for a memory operation of a test mode;

receiving a row address strobe bar signal, a column address strobe bar signal, and a write enable signal, as test mode determining signals;

generating first and second test mode setting signals;

switching a word line model signal from a row address circuit or the test word line model signal, in accordance with the first test mode setting signal;

switching a column address pulse enable signal inputted from a column address pulse enable signal generating circuit or the test column address pulse enable signal in accordance with the second test mode setting signal; and outputting the switched signal to a pulse generation unit.

18. A test apparatus, comprising:
a test signal input unit that externally receives at least one test signal, which is used for a memory operation of a test mode;
a test mode setting unit that receives at least one input signal, and that generates a first test mode setting signal;
a first switching unit that switches a first signal inputted from a row address circuit or one of the at least one test signal inputted from the test signal input unit, in accordance with the first test mode setting signal.

19. The test apparatus of claim 18, wherein the test mode setting unit generates a second test mode setting signal, and the test apparatus further comprises:
a second switching unit that switches a second signal inputted from a column address pulse enable signal generating circuit or another one of the at least one test signal inputted from the test signal input unit, in accordance with the second test mode setting signal.

* * * * *